United States Patent
Lee

(10) Patent No.: US 9,640,662 B2
(45) Date of Patent: May 2, 2017

(54) METHOD FOR FABRICATING SEMICONDUCTOR DEVICE

(71) Applicant: UNITED MICROELECTRONICS CORP., Hsin-Chu (TW)

(72) Inventor: Hao-Ming Lee, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/350,113

(22) Filed: Nov. 14, 2016

(65) Prior Publication Data

US 2017/0062430 A1    Mar. 2, 2017

Related U.S. Application Data

(62) Division of application No. 14/634,903, filed on Mar. 2, 2015, now Pat. No. 9,530,779.

(30) Foreign Application Priority Data

Jan. 26, 2015  (TW) .............................. 104102601 A

(51) Int. Cl.
*H01L 21/8238* (2006.01)
*H01L 27/12* (2006.01)
*H01L 29/78* (2006.01)
*H01L 21/84* (2006.01)

(52) U.S. Cl.
CPC .......... *H01L 29/785* (2013.01); *H01L 21/845* (2013.01); *H01L 27/1211* (2013.01)

(58) Field of Classification Search
CPC ............................ H01L 27/1211; H01L 29/785

USPC .......... 438/219–226, 300; 257/288, 345, 351
See application file for complete search history.

(56) References Cited

U.S. PATENT DOCUMENTS

| | | | |
|---|---|---|---|
| 8,664,060 B2 * | 3/2014 | Liu | H01L 29/66795 257/255 |
| 8,703,556 B2 | 4/2014 | Kelly | |
| 8,753,942 B2 * | 6/2014 | Kuhn | B82Y 10/00 257/24 |
| 8,765,546 B1 * | 7/2014 | Hung | H01L 21/82343 257/190 |
| 9,202,915 B2 | 12/2015 | Xu | |
| 9,412,814 B2 * | 8/2016 | Lee | H01L 29/0653 257/295 |
| 9,530,779 B2 * | 12/2016 | Lee | H01L 21/82343 257/190 |
| 2006/0180866 A1 | 8/2006 | Zhu et al. | |
| 2010/0193840 A1 | 8/2010 | Doyle et al. | |
| 2016/0172496 A1 * | 6/2016 | Chang | H01L 29/7848 257/190 |

* cited by examiner

*Primary Examiner* — Calvin Lee
(74) *Attorney, Agent, or Firm* — Winston Hsu; Scott Margo

(57) ABSTRACT

A method for fabricating semiconductor device includes the steps of: providing a substrate having at least one fin-shaped structure thereon, wherein the fin-shaped structure comprises a top portion and a bottom portion; removing part of the bottom portion of the fin-shaped structure; forming an epitaxial layer on the substrate to surround the bottom portion of the fin-shaped structure; transforming the bottom portion of the fin-shaped structure into the epitaxial layer; and removing part of the epitaxial layer.

9 Claims, 7 Drawing Sheets

METHOD FOR FABRICATING SEMICONDUCTOR DEVICE

CROSS REFERENCE TO RELATED APPLICATIONS

This application is a division of U.S. application Ser. No. 14/634,903 filed Mar. 2, 2015, and incorporated herein by reference in its entirety.

BACKGROUND OF THE INVENTION

1. Field of the Invention

The invention relates to a semiconductor device and fabrication method thereof, and more particularly, to an approach of fabricating fin-shaped structure on NMOS region having top portion composed of silicon and bottom portion composed of silicon germanium and fin-shaped structure on PMOS region having top portion composed of silicon germanium and bottom portion composed of silicon.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the overall architecture of fin-shaped structure still poses numerous problems in current FinFET fabrication, which not only affects the carrier mobility in the channel region but also influences overall performance of the device. Hence, how to improve the current FinFET process has become an important task in this field.

SUMMARY OF THE INVENTION

According to a preferred embodiment of the present invention, a method for fabricating semiconductor device is disclosed. The method includes the steps of: providing a substrate having at least one fin-shaped structure thereon, wherein the fin-shaped structure comprises a top portion and a bottom portion; removing part of the bottom portion of the fin-shaped structure; forming an epitaxial layer on the substrate to surround the bottom portion of the fin-shaped structure; transforming the bottom portion of the fin-shaped structure into the epitaxial layer; and removing part of the epitaxial layer.

According to another aspect of the present invention, a semiconductor device is disclosed. The semiconductor device includes a substrate having a NMOS region and a PMOS region thereon; a first fin-shaped structure on the NMOS region of the substrate, and a second fin-shaped structure on the PMOS region of the substrate. Preferably, the top portion and bottom portion of the first fin-shaped structure are composed of different material, and the top portion and bottom portion of the second fin-shaped structure are also composed of different material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
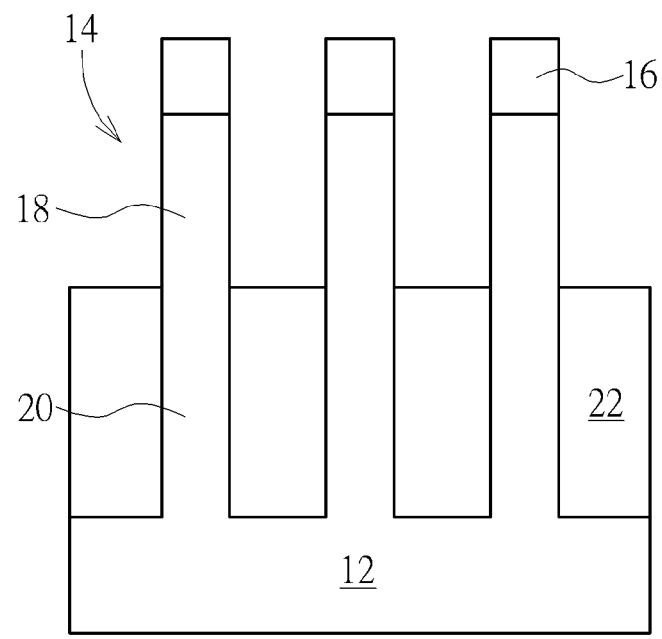
FIGS. 1-7 illustrate a method for fabricating semiconductor device according to a first embodiment of the present invention.

Referring to FIGS. 1-7, FIGS. 1-7 illustrate a method for fabricating semiconductor device according to a first embodiment of the present invention. As shown in FIG. 1, a substrate 12, such as a silicon substrate is provided, and at least a transistor region, such as a NMOS region is defined on the substrate 12. In addition, at least a fin-shaped structure 14 and a hard mask 16 thereon is formed on the substrate 12, and an insulating layer (not shown) composed of silicon oxide is formed to surround the fin-shaped structure 14 and hard mask 16, in which the top surface of the insulating layer is preferably even with the top surface of the hard mask 16. It should be noted that even though three fin-shaped structures 14 are disclosed in this embodiment, the quantity of the fin-shaped structures 14 is not limited to three.

The formation of the fin-shaped structures 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14.

In this embodiment, each of the fin-shaped structures 14 includes a top portion 18 and a bottom portion 20, in which the top portion 18 and the bottom portion 20 preferably share substantially same height and divide the fin-shaped structures 14 into upper and lower portions evenly. Next, an etching back process is conducted by using the hard masks 16 as etching mask to remove part of the insulating layer so that the remaining insulating layer only surrounds the bottom portion 20 of the fin-shaped structures 14, or the top surface of the insulating layer being coplanar to the intersecting point of the top portion 18 and bottom portion 20 of the fin-shaped structures 14. This forms a shallow trench isolation (STI) 22 around the fin-shaped structures 14.

Figure 2:
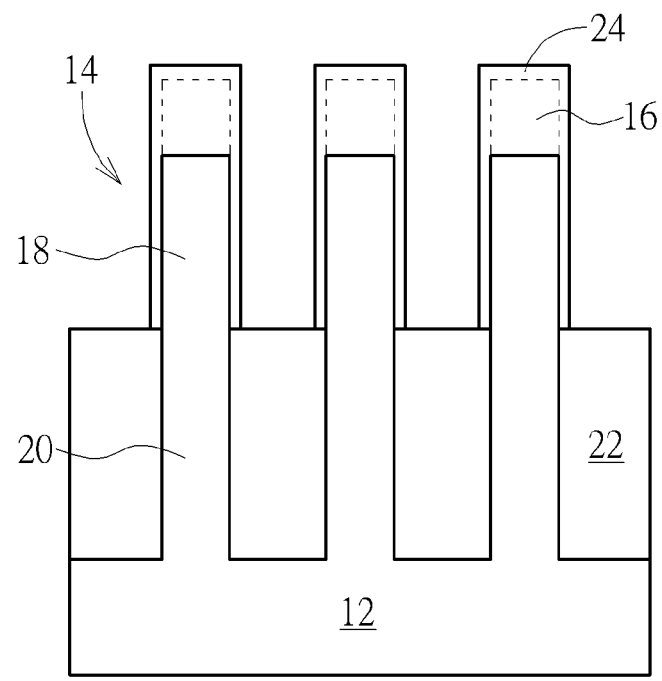

Next, as shown in FIG. 2, spacers 24 are formed on the hard masks 16 and sidewalls of the top portions 18 of fin-shaped structures 14. The formation of the spacers 24 could be accomplished by first covering a dielectric material composed of silicon nitride on the hard mask 16, fin-shaped structures 14, and STI 22, and then performing an etching back process to remove part of the dielectric material to form the spacers 24. In this embodiment, the spacers 24 and the hard masks 16 are preferably composed of same material such as both being composed of silicon nitride. Nevertheless, it would also be desirable to use different material for forming the spacers 24 and hard masks 16 individually, which is also within the scope of the present invention.

Figure 3:
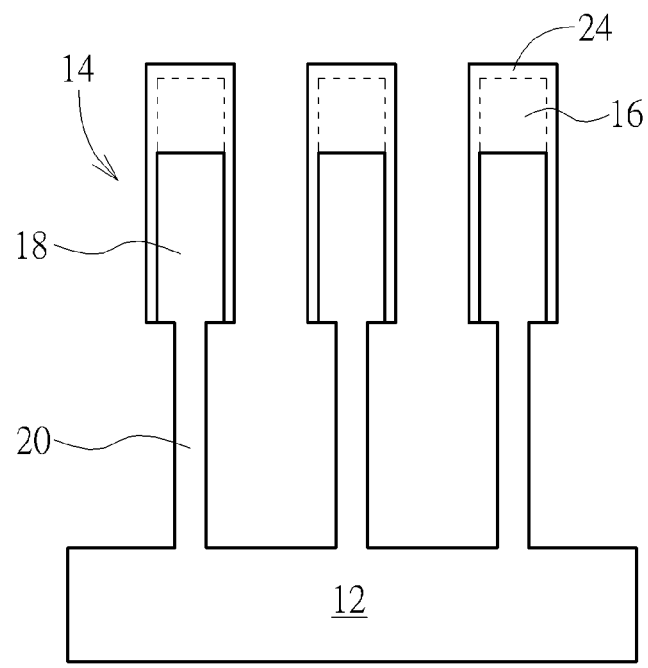

Next, as shown in FIG. 3, an etching process is conducted to remove the STI 22 to expose the bottom portions 20 of the fin-shaped structures 14, and another dry etching or wet etching process, such as isotropic etching or lateral etching is conducted by using the spacers 24 as mask to remove part of the bottom portions 20 of the fin-shaped structures 14 so that the width of each top portion 18 is greater than the width of each bottom portion 20. In this embodiment, the width of each bottom portion 20 of fin-shaped structures 14 being removed is at least greater than half the width of each top portion 18, but not limited thereto.

Figure 4:
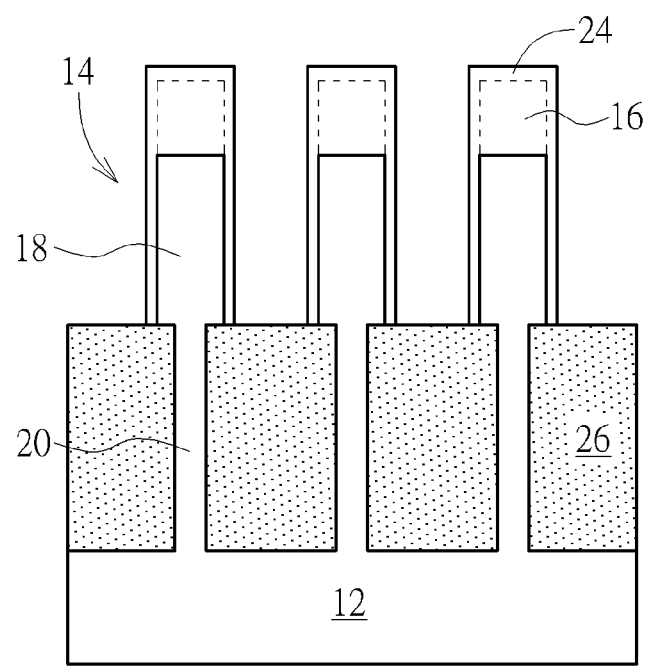

Next, as shown in FIG. 4, a selective epitaxial growth process is conducted to form an epitaxial layer 26 on the substrate 12 and surround the bottom portions 20 of fin-shaped structures 14. The epitaxial layer 26 is preferably composed of silicon germanium or silicon containing dopants therein, in which the dopants are preferably p-type dopants so that the layer could be serving as an anti-punch-through layer to prevent leakage for the NMOS transistor.

Figure 5:
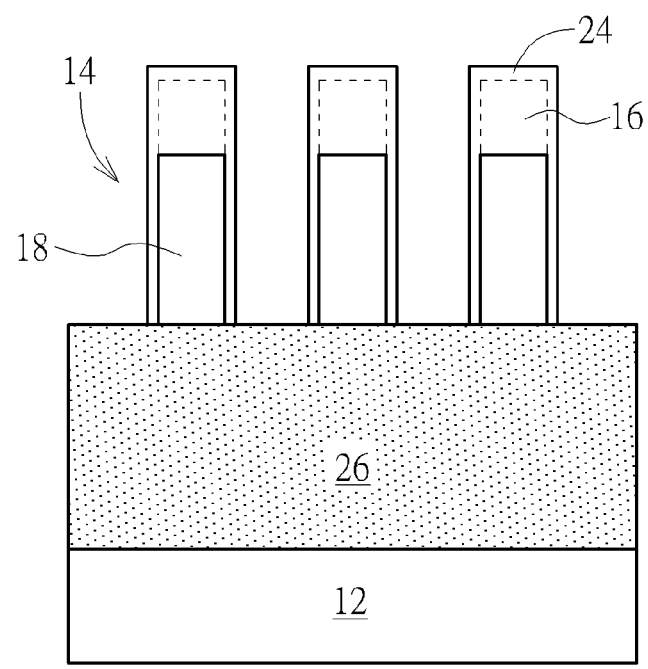

Next, as shown in FIG. 5, a thermal treatment, such as a thermal anneal process is conducted by using a temperature greater than 800° C. to transform the bottom portions 20 of fin-shaped structures 14 into epitaxial layer 26, in which the bottom portions 20 originally composed of pure silicon are preferably transformed into epitaxial layer 26 composed silicon germanium completely through the aforementioned thermal treatment. In other words, the bottom portions 20 of fin-shaped structures 14 are preferably merged with surrounding epitaxial layer 26 after the thermal treatment to form a structure having top portions 18 composed of pure silicon sitting on epitaxial layer 26 composed of silicon germanium.

Figure 6:
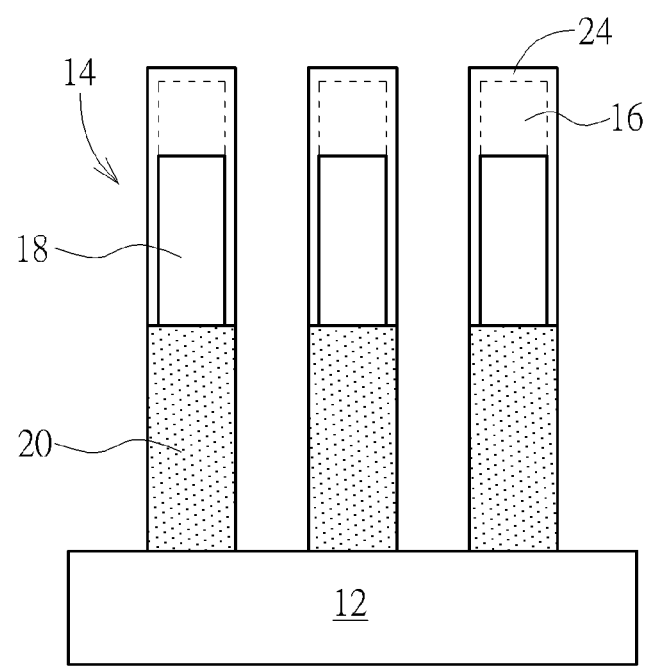

Next, as shown in FIG. 6, an anisotropic etching process is conducted by using the spacers 24 as mask to remove part of the epitaxial layer 26 so that the remaining epitaxial layer 26 and top portions 18 of fin-shaped structures 14 would form a pillar-shaped structure altogether and expose part of the substrate 12 surface. It should be noted that as the epitaxial layer 26 are removed against the sidewall of the spacers 24, the width of each remaining epitaxial layer 26 or each bottom portion 20 of fin-shaped structures 14 is preferably greater than the width of each top portion 18, in which the width difference between portions 18 and 20 is substantially equal to the width of a spacer 24.

Figure 7:
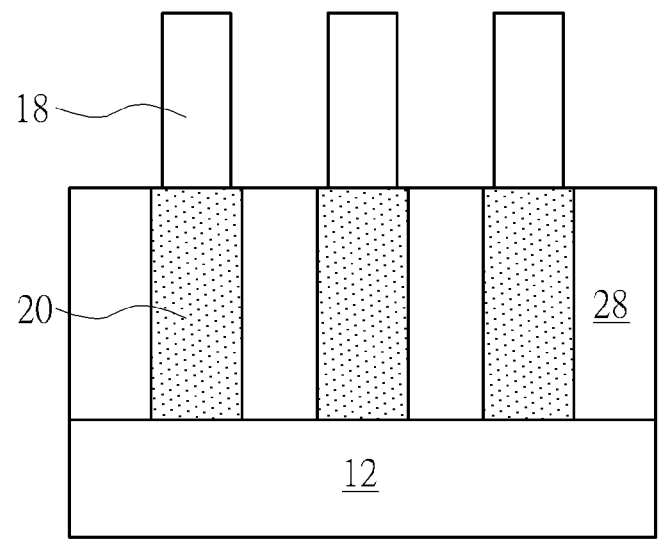

After removing the spacers 24, as shown in FIG. 7, an insulating layer (not shown) is deposited on the substrate 12 to surround the fin-shaped structures 14, in which the insulating layer is preferably composed of silicon oxide, but not limited thereto. A planarizing process such as chemical mechanical polishing (CMP) is then conducted to remove part of the insulating layer and the hard mask 16 so that the remaining insulating layer surface and the fin-shaped structures 14 surface are coplanar. Next, an etching back is carried out to remove part of the insulating layer so that the remaining insulating layer only surrounds the bottom portion 20 of fin-shaped structures 14 or that the remaining insulating layer surface is substantially aligned with the intersecting point between top portion 18 and bottom portion 20 for forming a STI 28. Formation of transistor elements including gate structure, spacer, and source/drain region could be carried out thereafter depending on the demand of the process and the details of which are not explained herein for the sake of brevity. This completes the fabrication of a semiconductor device according to a first embodiment of the present invention.

Figure 8:
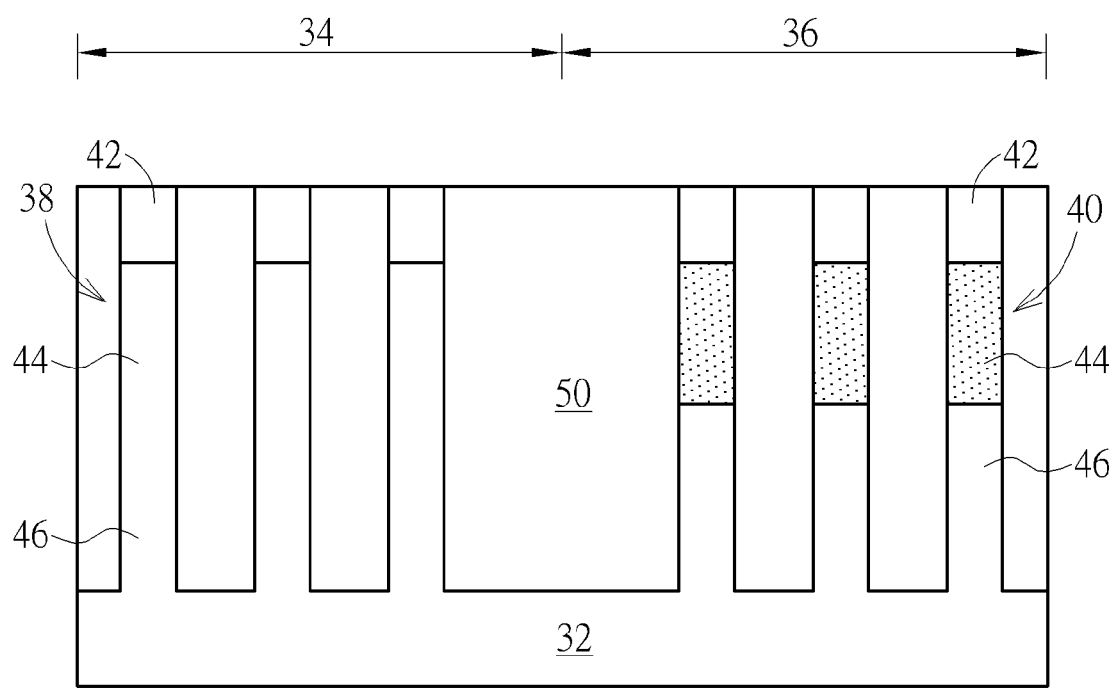
FIGS. 8-14 illustrate a method for fabricating a semiconductor device according to a second embodiment of the present invention.

Referring to FIGS. 8-14, FIG. 8-14 illustrate a method for fabricating a semiconductor device according to a second embodiment of the present invention. As shown in FIG. 8, a substrate 32, such as a silicon substrate is first provided, and a NMOS region 34 and a PMOS region 36 are defined on the substrate 32. A plurality of fin-shaped structures 38 and 40 are formed on NMOS region 32 and PMOS region 34 respectively, a hard mask 42 is disposed on each of the fin-shaped structures 38 and 40, and an insulating layer 50 composed of silicon oxide is formed to surround the fin-shaped structures 38 and 40, in which the top surface of insulating layer 50 is even with the hard mask 42 top surface. In this embodiment, each of the fin-shaped structures 38 and 40 includes a top portion 44 and a bottom portion 46, in which the top portion 44 and the bottom portion 46 preferably share substantially same height and divide the fin-shaped structures 38 and 40 into upper and lower portions evenly. It should also be noted that both top portion 44 and bottom portion 46 of the fin-shaped structures 38 on NMOS region 34 are composed of pure silicon while the top portion 44 and bottom portion 46 of the fin-shaped structures 40 on PMOS region 36 are composed of different material. For instance, the top portion 44 of the fin-shaped structures 40 on PMOS region 36 is composed epitaxial containing silicon germanium while the bottom portion 46 is composed of pure silicon.

In this embodiment, the formation of the fin-shaped structures 38 and 40 shown in FIG. 8 could be accomplished by first providing a substrate 32 composed of pure silicon, using a mask to remove part of the substrate 32 on PMOS region 36, forming an epitaxial layer composed of silicon germanium through process such as selective epitaxial growth on substrate 32 of PMOS region 36 while controlling the substrate 32 surface of the NMOS region 34 to be substantially even with the epitaxial layer on PMOS region 36, and then covering a hard mask 42 composed of silicon nitride on the substrate 32 of NMOS region 34 and epitaxial layer of PMOS region 34. A photo-etching process is conducted thereafter by using a patterned resist (not shown) as mask to remove part of hard mask 42 and part of substrate 32 from NMOS region 34 and part of hard mask 42, part of epitaxial layer, and part of substrate 32 from PMOS region 36 for forming the fin-shaped structures 38 and 40.

Figure 9:
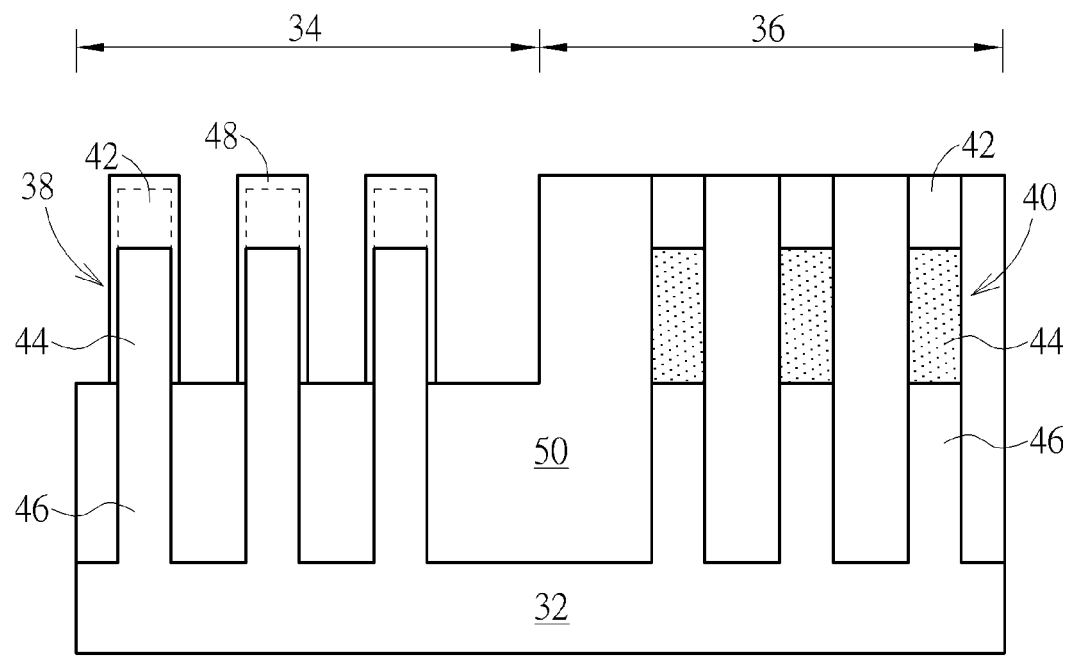

Next, as shown in FIG. 9, a photo-etching process is conducted by first forming a patterned resist (not shown) on the PMOS region 36, and then conducting an etching process to remove part of the insulating layer 50 on NMOS region 34 till reaching the intersecting point between top portion 44 and bottom portion 46 of the fin-shaped structures 38. This exposes the top portion 44 of the fin-shaped structures 38. Next, spacers 48 are formed on the hard masks 42 and sidewalls of top portions 44 of NMOS region 34. The formation of the spacers 48 could be accomplished by first covering a dielectric material composed of silicon nitride on the hard mask 42, fin-shaped structures 38, and insulating layer 50, and then performing an etching back process to remove part of the dielectric material to form the spacers 48. In this embodiment, the spacers 48 and hard masks 42 are preferably composed of same material such as both being composed of silicon nitride. However, it would also be desirable to use different material for forming spacers 48 and hard masks 42 individually, which is also within the scope of the present invention.

Figure 10:
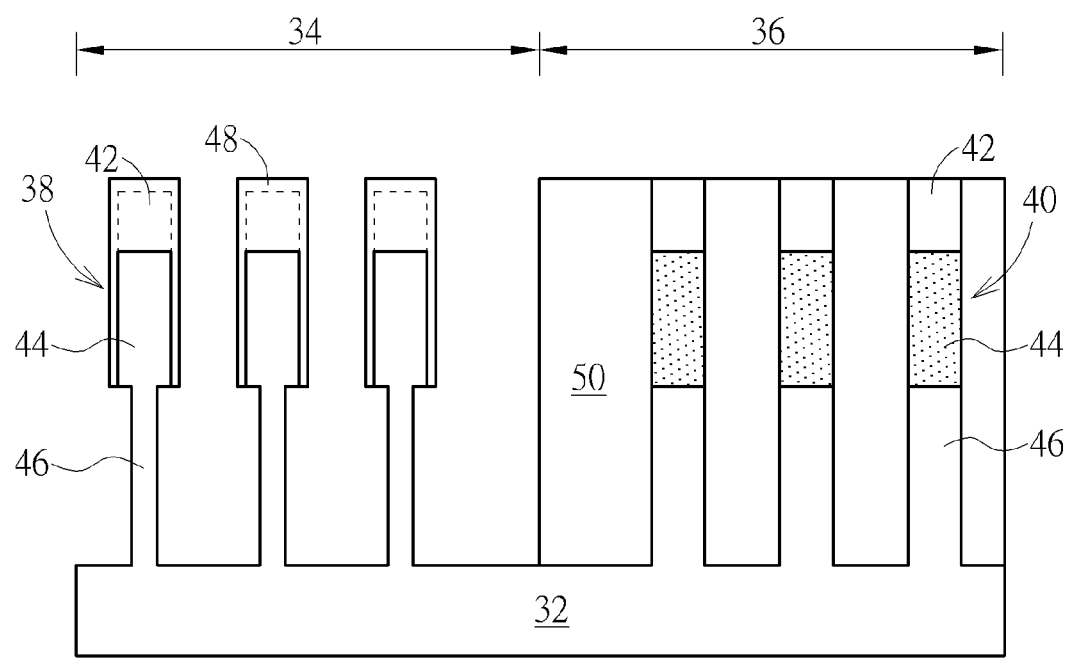

Next, as shown in FIG. 10, an etching process is conducted to completely remove the insulating layer 50 of NMOS region 34 to expose the bottom portion 46 of fin-shaped structures 38, and another dry etching or wet etching process, such as isotropic etching or lateral etching is conducted by using the spacers 48 as mask to remove part of the bottom portions 46 of the fin-shaped structures 38 so that the width of each top portion 44 is greater than the width of each bottom portion 46. Similar to the first embodiment, the width of the removed bottom portion 46 of each bottom portion 46 of fin-shaped structures 38 being removed is at least greater than half the width of each top portion 44, but not limited thereto.

Figure 11:
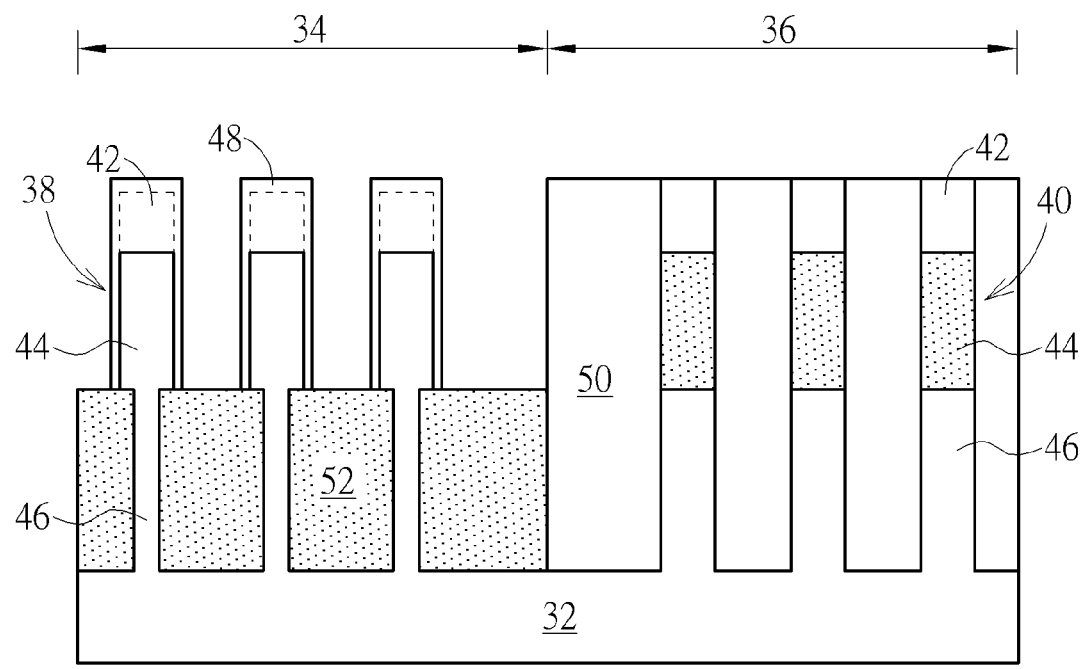

Next, as shown in FIG. 11, a selective epitaxial growth process is conducted to form an epitaxial layer 52 on the substrate 32 and surround the bottom portions 46 of fin-shaped structures 38 of NMOS region 34. The epitaxial layer 52 is preferably composed of silicon germanium or silicon containing dopants therein, in which the dopants are preferably p-type dopants so that the layer could be used as an anti-punch-through layer to prevent current leakage for the NMOS transistor.

Figure 12:
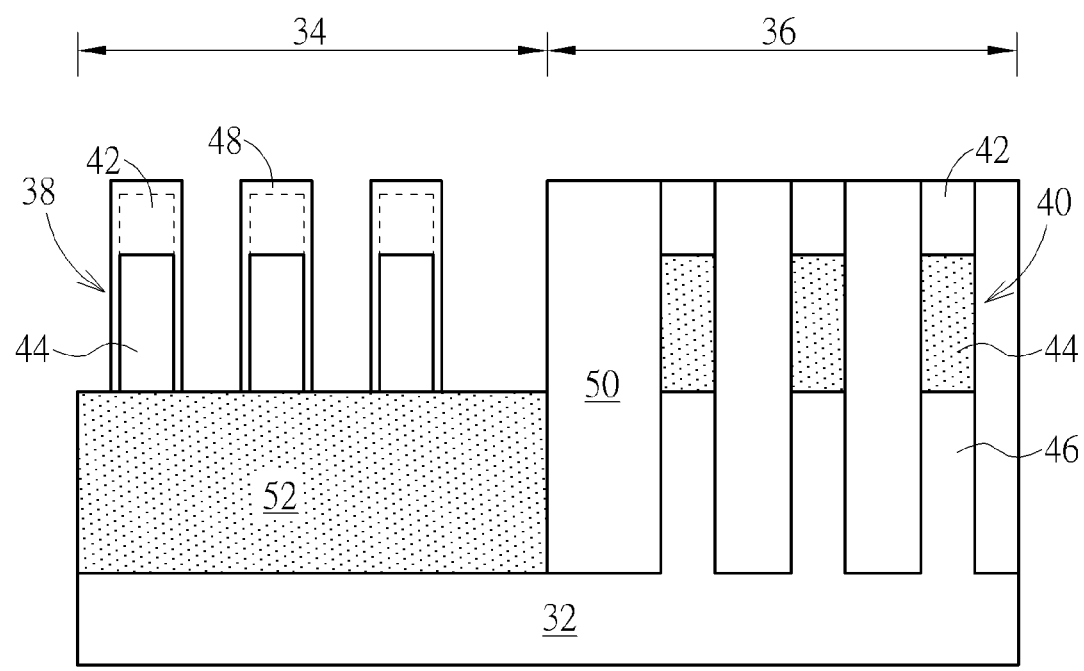

Next, as shown in FIG. 12, a thermal treatment, such as a thermal anneal process is conducted by using a temperature greater than 800° C. to transform the bottom portions 46 of fin-shaped structures 38 into epitaxial layer 52, in which the bottom portions 46 originally composed of pure silicon are preferably transformed into epitaxial layer 52 composed of silicon germanium completely through the aforementioned thermal treatment. In other words, the bottom portions 46 of fin-shaped structures 38 are preferably merged with surrounding epitaxial layer 52 after the thermal treatment to form a structure having top portions 44 composed of pure silicon sitting on epitaxial layer 52 composed of silicon germanium.

Figure 13:
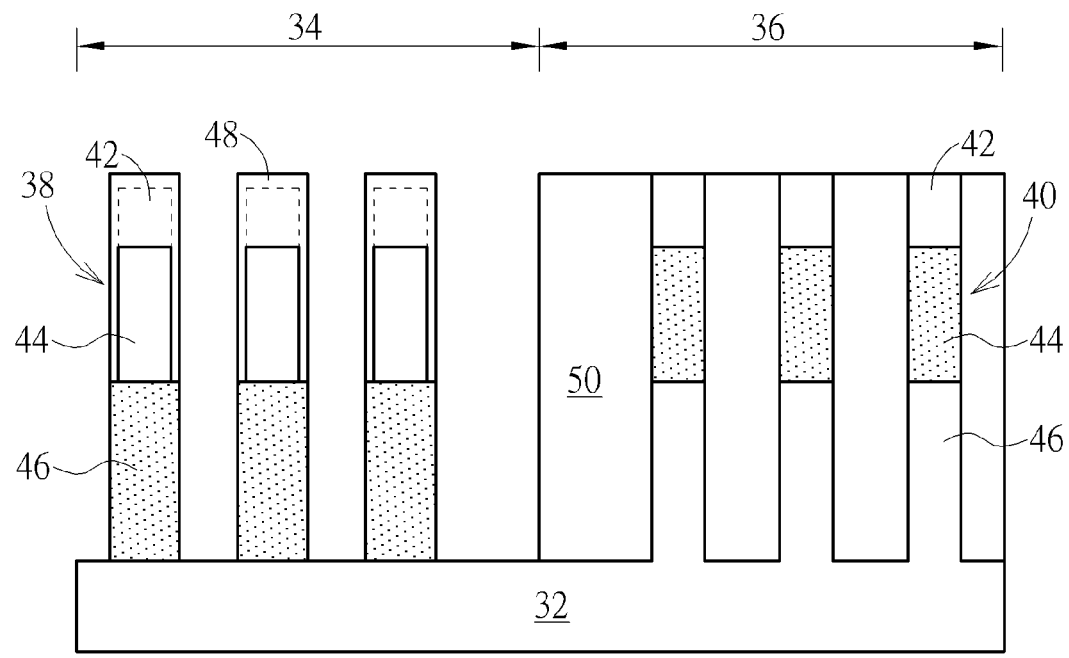

Next, as shown in FIG. 13, an etching process is conducted by using the spacer 48 as mask to remove part of the epitaxial layer 52 so that the remaining epitaxial layer 52 and top portions 44 of fin-shaped structures 38 would form a pillar-shaped structure altogether and expose part of the substrate 32 surface. Similar to the first embodiment, as the epitaxial layer 52 are removed against the sidewall of the spacers 48 during the etching process, the width of each remaining epitaxial layer 52 or each bottom portion 46 of fin-shaped structures 38 is preferably greater than the width of each top portion 44, in which the width difference between portions 44 and 46 is approximately equal to the width of a spacer 48.

Figure 14:
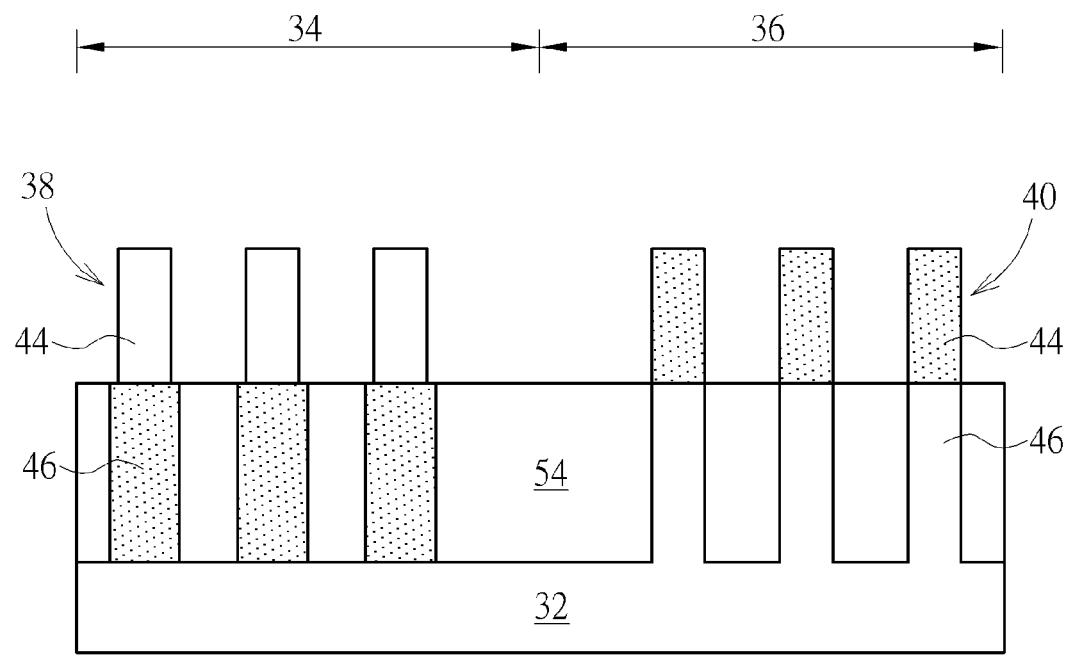

Next, as shown in FIG. 14, an insulating layer (not shown) is deposited on the substrate 32 to surround the fin-shaped structures 38 on NMOS region 34, fin-shaped structures 40 on PMOS region 36, and insulating layer 50, in which the insulating layer is preferably composed of silicon oxide, but not limited thereto. A planarizing process such as CMP is then conducted to remove part of the insulating layer and hard masks 42 on NMOS region 34 so that the remaining insulating layer surface and top surfaces of fin-shaped structures 38 and 40 are coplanar. Next, an etching back is carried out to remove part of the insulating layer so that the remaining insulating layer only surrounds the bottom portions 46 of fin-shaped structures 38 and 40 or that the remaining insulating layer surface is substantially aligned with the intersecting point between top portion 44 and bottom portion 46 for forming a STI 54. Formation of transistor elements including gate structure, spacer, and source/drain region could be carried out thereafter depending on the demand of the process and the details of which are not explained herein for the sake of brevity. This completes the fabrication of a semiconductor device according to a second embodiment of the present invention.

Referring again to FIG. 14, which illustrates a structural view of a semiconductor device according to a preferred embodiment of the present invention. As shown in FIG. 14, the semiconductor device includes a substrate 32, at least a fin-shaped structure 38 disposed on NMOS region 34 of the substrate 32 and at least a fin-shaped structure 40 disposed on PMOS region 36 of the substrate 32, in which each of the fin-shaped structures 38 and 40 includes a top portion 44 and a bottom portion 46 and the top portion 44 and bottom portion 46 of each of the regions 34 and 36 are preferably composed of different material.

Specifically, the top portion 44 of fin-shaped structures 38 on NMOS region 34 and bottom portion 46 of fin-shaped structures 40 on PMOS region 36 share same material, and bottom portion 46 of fin-shaped structures 38 on NMOS region 34 and top portion 44 of fin-shaped structures 40 on PMOS region 36 share same material, or in this embodiment, the top portion 44 of fin-shaped structures 38 on NMOS region 34 and bottom portion 46 of fin-shaped structures 40 on PMOS region 36 are composed of silicon while the bottom portion 46 of fin-shaped structures 38 on NMOS region 34 and top portion 44 of fin-shaped structures 40 on PMOS region 36 are composed of silicon germanium.

Overall, the present invention discloses an approach of forming top portion and bottom portion of a fin-shaped structure with different material. In fabricating a NMOS transistor, the present invention preferably forms a fin-shaped structure composed of pure silicon on a substrate, removes part of the bottom portion of the fin-shaped structure, forms an epitaxial layer surrounding the thinned bottom portion of fin-shaped structure, transforms the bottom portion of fin-shaped structure into epitaxial layer entirely, and then removes part of the epitaxial layer so that the remaining epitaxial layer and the original top portion of fin-shaped structure would form a pillar-shaped fin altogether. In fabricating a CMOS transistor, both the top portion of fin-shaped structure on NMOS region and the bottom portion of fin-shaped structure on PMOS region are composed of silicon while both the bottom portion of fin-shaped structure on NMOS region and top portion of fin-shaped structure on PMOS are composed of silicon germanium. By using this design, it would be desirable to improve carrier mobility in the channel region and also boost up the overall performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having at least one fin-shaped structure thereon, wherein the fin-shaped structure comprises a top portion, a bottom portion, and a hard mask thereon;

forming a first shallow trench isolation (STI) around the fin-shaped structure;

using the hard mask to remove the first STI;

forming a spacer on the hard mask and adjacent to the top portion of the fin-shaped structure;

completely removing the first STI followed by removing part of the bottom portion of the fin-shaped structure;

forming an epitaxial layer on the substrate to surround the bottom portion of the fin-shaped structure;

transforming the bottom portion of the fin-shaped structure into the epitaxial layer; and removing part of the epitaxial layer.

2. The method of claim 1, further comprising:

removing the spacer after removing part of the epitaxial layer;

depositing an insulating layer on the substrate;

planarizing the insulating layer;

removing the hard mask; and etching back the insulating layer for forming a second STI.

3. The method of claim 1, wherein the hard mask and the spacer comprise silicon nitride.

4. The method of claim 1, further comprising performing a thermal anneal process after forming the epitaxial layer to transform the bottom portion of the fin-shaped structure into the epitaxial layer.

5. The method of claim 1, wherein the fin-shaped structure comprises silicon.

6. The method of claim 1, further comprising transforming the entire bottom portion of the fin-shaped structure into the epitaxial layer.

7. The method of claim 1, further comprising removing all of the epitaxial layer not covered by the top portion of the fin-shaped structure.

8. The method of claim 1, wherein the epitaxial layer comprises silicon germanium.

9. The method of claim 8, wherein the semiconductor device comprises a NMOS transistor.

\* \* \* \* \*